US011373975B2

(12) United States Patent
Seyama

(10) Patent No.: US 11,373,975 B2
(45) Date of Patent: Jun. 28, 2022

(54) ELECTRONIC COMPONENT MOUNTING DEVICE

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 82 days.

(21) Appl. No.: 16/496,456

(22) PCT Filed: Mar. 28, 2017

(86) PCT No.: PCT/JP2017/012518
§ 371 (c)(1),
(2) Date: Oct. 23, 2019

(87) PCT Pub. No.: WO2018/179074
PCT Pub. Date: Oct. 4, 2018

(65) Prior Publication Data
US 2020/0373275 A1    Nov. 26, 2020

(51) Int. Cl.
*H01L 23/00*  (2006.01)
*H01L 21/304* (2006.01)
*H01L 23/29*  (2006.01)

(52) U.S. Cl.
CPC ............ *H01L 24/75* (2013.01); *H01L 21/304* (2013.01); *H01L 23/29* (2013.01); *H01L 24/83* (2013.01);
(Continued)

(58) Field of Classification Search
CPC ......... H01L 24/83; H01L 24/81; H01L 24/75; H01L 2224/8385; H01L 2224/83203;
(Continued)

(56) References Cited

U.S. PATENT DOCUMENTS 7,797,822 B2 *   9/2010   Sakai ............... H01L 21/67144
                                              29/832
7,968,428 B2 *   6/2011   Abe ..................... H01L 24/29
                                              438/458

(Continued)

FOREIGN PATENT DOCUMENTS

JP   2001127105   5/2001
JP   2006229126   8/2006
JP   2015035493   2/2015

OTHER PUBLICATIONS

"International Search Report (Form PCT/ISA/210) of PCT/JP2017/012518," dated Jun. 20, 2017, with English translation thereof, pp. 1-2.

*Primary Examiner* — Michael M Trinh
(74) *Attorney, Agent, or Firm* — JCIPRNET

(57) ABSTRACT

An electronic component mounting device (100) bonds a semiconductor die (150) to a substrate by thermocompression bonding, and seals, using an insulating resin, a gap between the semiconductor die (150) and the substrate. The electronic component mounting device is provided with: a film cutting mechanism (200) for cutting a long film (210) into cut pieces; and a mounting tool (110), which vacuum-sucks the semiconductor die (150), and bonds the die to the substrate by thermocompression bonding. Consequently, in the electronic component mounting device (100) that moves a mounting head in the horizontal direction, adhesion of the insulating resin to the mounting tool can be suppressed.

4 Claims, 15 Drawing Sheets

(52) U.S. Cl.
CPC ............... *H01L 2224/75252* (2013.01); *H01L 2224/75318* (2013.01); *H01L 2224/75745* (2013.01); *H01L 2224/8385* (2013.01); *H01L 2224/83203* (2013.01)

(58) Field of Classification Search
CPC . H01L 2224/83191; H01L 2224/83862; H01L 2224/81203; H01L 2224/81191; H01L 2224/81; H01L 2224/83; H01L 2224/75252; H01L 2224/75745; H01L 2224/75318; H01L 2224/73104; H01L 21/304; H01L 21/67144
See application file for complete search history.

(56) References Cited

U.S. PATENT DOCUMENTS

| | | | |
|---|---|---|---|
| 10,872,875 B2* | 12/2020 | Lee | H01L 24/73 |
| 11,024,596 B2* | 6/2021 | Watanabe | H01L 24/83 |
| 2005/0016678 A1* | 1/2005 | Kurosawa | H01L 21/67132 |
| | | | 156/716 |
| 2012/0043005 A1* | 2/2012 | Yamakami | H01L 24/83 |
| | | | 156/60 |
| 2017/0309503 A1* | 10/2017 | Seyama | H01L 21/67144 |
| 2021/0005570 A1* | 1/2021 | Watanabe | B32B 37/02 |

* cited by examiner

ELECTRONIC COMPONENT MOUNTING DEVICE

CROSS-REFERENCE TO RELATED APPLICATION

This application is a 371 application of the International PCT application serial no. PCT/JP2017/012518, filed on Mar. 28, 2017. The entirety of each of the above-mentioned patent applications is hereby incorporated by reference herein and made a part of this specification.

TECHNICAL FIELD

The present invention relates to a structure of an electronic component mounting device that thermocompression-bonds an electronic component such as a semiconductor die to a substrate.

BACKGROUND ART

One of methods of mounting an electronic component such as a semiconductor die on a substrate is a method of thermocompression-bonding an electronic component onto a substrate using a mounting tool after applying a liquefied insulating resin to the substrate or sticking a film-shaped insulating resin to the back side of the electronic component. In this mounting method, bonding of the substrate and the electronic component and hardening of a sealing resin between the electronic component and the substrate can be performed at one time. However, in this mounting method, there is a problem that the insulating resin oozing out between the electronic component and the substrate contaminates the mounting tool. For this reason, a method of preventing an insulating resin oozing out between the electronic component and the substrate from adhering to the mounting tool is used by performing thermocompression bonding between the mounting tool and the electronic component with a film interposed therebetween. In this method, a method is used of using a film transport mechanism for transporting the film and thereby updating a film interposed between the mounting tool and the electronic components whenever an electronic component is mounted (see, for example, Japanese Patent Laid-Open No. 2015-35493).

CITATION LIST

Patent Literature

Patent Literature 1
  Japanese Patent Laid-Open No. 2015-35493

SUMMARY OF INVENTION

Technical Problem

An electronic component mounting device disclosed in Japanese Patent Laid-Open No. 2015-35493 includes a mounting head that vertically moves a mounting tool with respect to a substrate, and a substrate stage that holds the substrate and performs alignment between a bonding position of the substrate and the mounting tool by moving the substrate in a horizontal direction, and a film transport mechanism subsequently updating films is mounted on the mounting head.

On the other hand, in recent years, an electronic component mounting device that thermocompression-bonds a semiconductor die on a substrate by horizontally moving a mounting head which make a mounting tool adsorbing the semiconductor die moves vertically has been used.

Such an electronic component mounting device also has a problem that an insulating resin oozing out between an electronic component and a substrate contaminates a mounting tool. However, since the film transport mechanism as disclosed in Japanese Patent Laid-Open No. 2015-35493 has a large size and a heavy weight, there is a problem that the size of the electronic component mounting device is increased when the film transport mechanism is mounted on the electronic component mounting device that horizontally moves the mounting head.

An objective of the invention is to inhibit adhesion of an insulating resin to a mounting tool using a simple method.

Solution to Problem

An electronic component mounting device that thermocompression-bonds an electronic component to a substrate or another electronic component and seals a gap between the electronic component and the substrate or a gap between the electronic component and the other electronic component using an insulating resin includes a film cutting mechanism which makes an end of a long film left in the width direction to cut out a sliced film, and a mounting tool which vacuum-suctions the electronic component through the sliced film and thermocompression-bonds the electronic component to the substrate or the other electronic component. The film cutting mechanism includes: a base body part; a film feeding roll, disposed on a side of the base body part, wherein the long film is wound around the film feeding roll; and a film take-up roll, disposed on the other side of the base body part, wherein the long film is fixed to the film take-up roll. The film feeding roll supplies the long film and the film take-up roll recovers the long film from which the sliced film is cut.

It is preferable that the electronic component mounting device of the invention further include a film recovery mechanism which receives the sliced film from a surface of the mounting tool.

In the electronic component mounting device of the invention, it is preferable that the mounting tool include a base and an island that protrudes from the base and vacuum-suctions the electronic component onto a surface thereof; the base body part of the film cutting mechanism has a hole having a size larger than a planar shape of the island; and the film cutting mechanism further includes a damper which has a hole having the same shape as the base body part and has the long film inserted between the clamper and the base body part, and includes a punch being inserted into and removed from the hole of the base body part and the hole of the clamper and cutting out the sliced film from the long film; and a surface of the punch in contact with the long film be a plane for transferring the sliced film on a surface of the mounting tool.

In the electronic component mounting device of the invention, it is preferable that the film recovery mechanism include a flat plate-shaped stage and an adsorption tape which moves along a surface of the stage to sequentially receive the sliced film from the surface of the mounting tool.

Advantageous Effects of Invention

The invention can inhibit adhesion of an insulating resin to a mounting tool using a simple method.

DESCRIPTION OF EMBODIMENTS

Hereinafter, an embodiment of the invention will be described with reference to the accompanying drawings. First, the overall configuration of an electronic component mounting device 100 according to the present embodiment will be described with reference to FIGS. 1 and 2.

Figure 1:
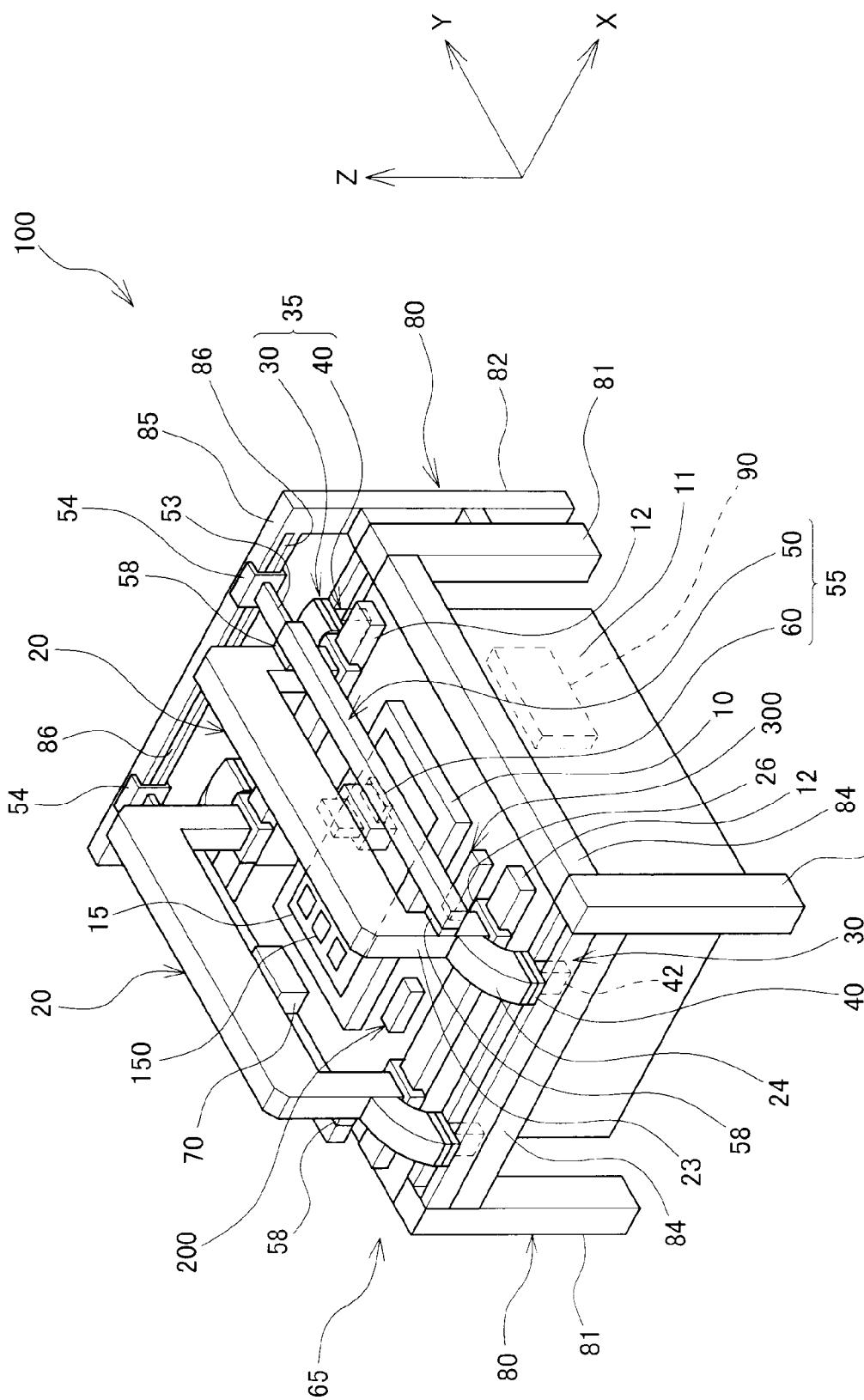
FIG. 1 is a perspective view of an electronic component mounting device according to an embodiment of the invention.

As shown in FIG. 1, the electronic component mounting device 100 according to the present embodiment includes a main stand 11, gantry frames 20 supported on the main stand 11, mounting heads 70 supported by the gantry frames 20, X-direction linear motors 35 that drive the gantry frames 20 in an X-direction, Y-direction linear motors 55 that drive the mounting heads 70 in a Y-direction, a sub-stand 80 which is disposed so as to be separated from the main stand 11, and a Y-direction load receiver 54 which is attached to the sub-stand 80. One end of the Y-direction stator 50 of the Y-direction linear motor 55 and the Y-direction load receiver 54 are connected to each other using a connection member 53. Meanwhile, the X-direction and the Y-direction are directions that are orthogonal to each other on a horizontal plane. In the present embodiment, a description will be given on the assumption that a direction in which the gantry frame 20 extends is a Y-direction and a direction orthogonal to the Y-direction is an X-direction, as shown in FIG. 1. In addition, a Z-direction is a vertical direction perpendicular to an XY plane.

As shown in FIG. 1, the main stand 11 is a stand having quadrilateral surfaces, and a mounting stage 10 being on an upper surface thereof and vacuum-suctioning a substrate 15 for mounting a semiconductor die 150 which is an electronic component, a film cutting mechanism 200, and a film recovery mechanism 300 are attached to the main stand. Linear guides 12 are attached parallel to each other in the vicinity of two facing sides of the upper surface of the main stand 11. A slider 26 is attached onto the linear guide 12 so as to be movable in the X-direction. In addition, leg parts 23 of the gantry frame 20 are respectively attached onto the sliders 26 of the two linear guides 12. That is, the gantry frame 20 extends in the Y-direction so as to cross over the main stand 11, and the leg parts 23 at both ends are attached to the slider 26 and supported so as to be movable in the X-direction.

In addition, the electronic component mounting device 100 according to the present embodiment includes the sub-stand 80 separated from the main stand 11 so as to surround the main stand 11 as shown in FIG. 1. The sub-stand 80 is a frame constituted by pillars 81 and 82 and a beam 84 connecting the pillars 81 and 82 to each other. A groove-shaped X-direction stator 30 of an X-direction linear motor 35 in which permanent magnets (not shown in the drawing) are disposed to face each other is attached onto the beam 84 extending in the X-direction. In addition, an X-direction needle 40 including a coil 42 moving between the permanent magnets (not shown in the drawing) of the X-direction stator 30 in the X-direction is attached to a tip end of an arm 24 extending from the leg part 23 of the gantry frame 20. The X-direction needles 40 of the X-direction linear motors 35 move in the X-direction together with the gantry frames 20.

Figure 3:
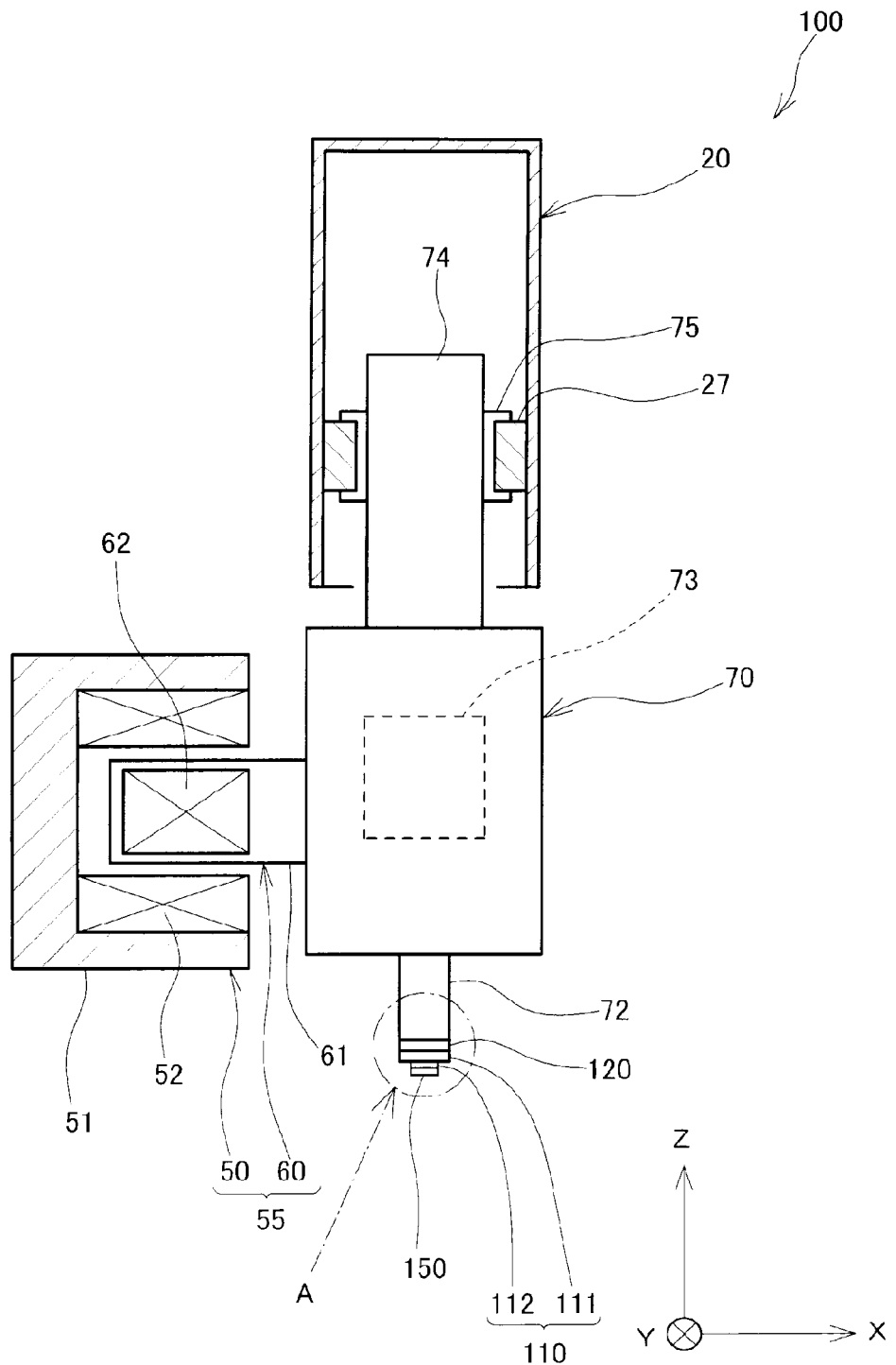
FIG. 3 is a cross-sectional view of a gantry frame of the electronic component mounting device according to the embodiment of the invention.

As shown in FIGS. 1 and 3, the gantry frame 20 supports the mounting head 70. A Z-direction driving mechanism 73 vertically moving a shaft 72 in the Z-direction is stored in the mounting head 70, and a heater 120 and a mounting tool 110 are attached to a tip end of the shaft 72. The Z-direction driving mechanism 73 vertically moves the heater 120 and the mounting tool 110 to press the semiconductor die 150 on the substrate 15 fixedly adsorbed into the mounting stage 10. As shown in FIG. 3, a space is provided inside the gantry frame 20, and two linear guides 27 extending in the Y-direction are attached onto both sides on the inner surface of the gantry frame 20. A slider 75 is attached to each of the linear guides 27, and a hanging member 74 of the mounting head 70 is attached to the two sliders 75.

Figure 2:
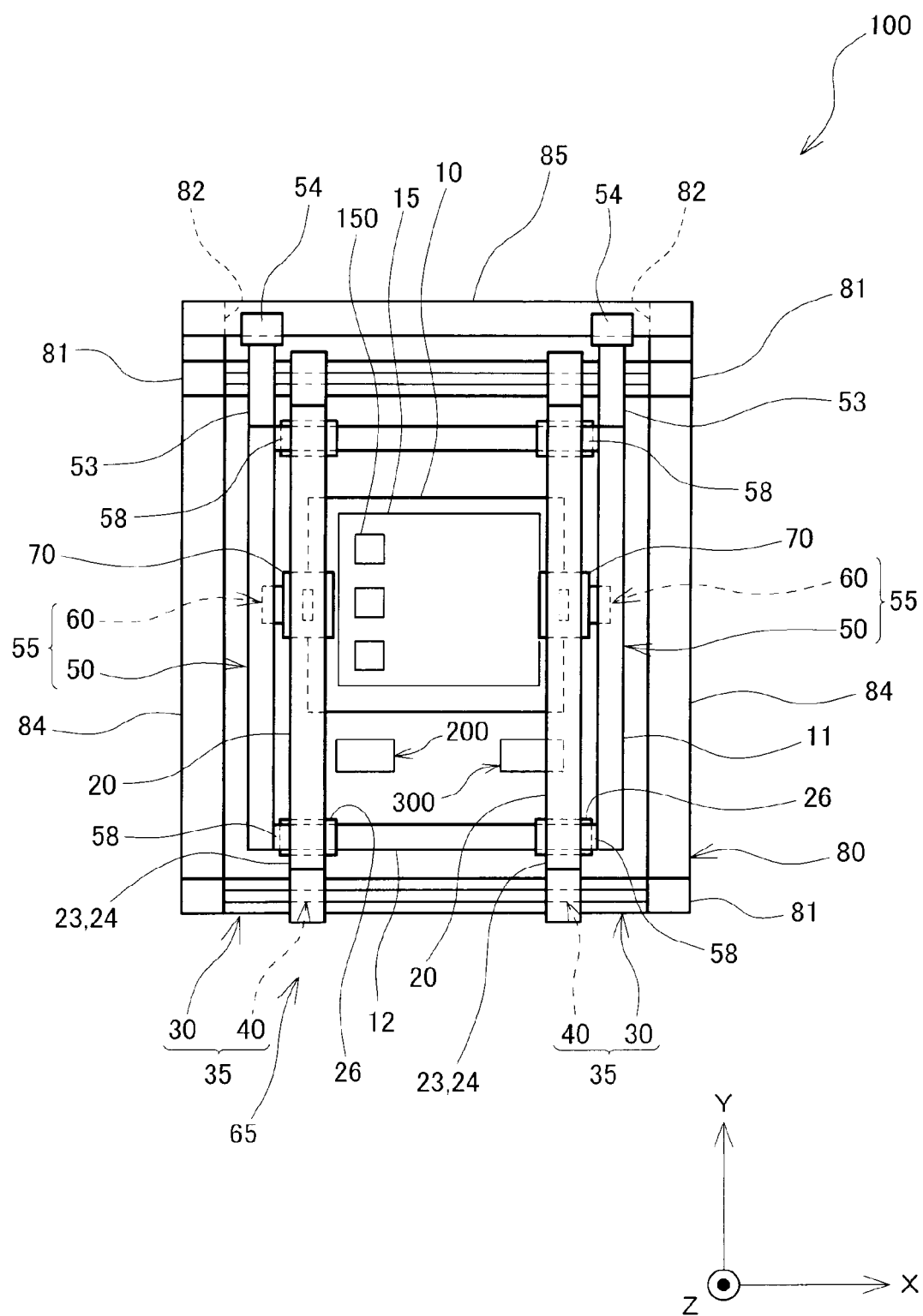
FIG. 2 is a plan view of the electronic component mounting device according to the embodiment of the invention.

As shown in FIGS. 1 and 2, the Y-direction stator 50 of the Y-direction linear motor 55 is attached between the leg parts 23 of the gantry frame 20 through a plate spring 58. As shown in FIG. 3, the Y-direction stator 50 is formed by arranging the permanent magnets 52 that face each other within an open space provided between inner surfaces of a groove-shaped frame 51. A frame 61 extending from the mounting head 70 is disposed in the space between the permanent magnets 52 of the Y-direction stator 50, and a coil 62 is attached to the inside of the frame 61. With such a configuration, the Y-direction needle 60 moves in the Y-direction together with the mounting head 70. In addition, the X-direction linear motor 35 has a similar internal structure to the Y-direction linear motor 55.

As shown in FIGS. 1 and 2, a linear guide 86 is attached to a beam 85 of the sub-stand 80, and the Y-direction load receiver 54 is slidably attached to the linear guide 86 in the X-direction. The Y-direction load receiver 54 and the Y-direction stator 50 are connected to each other through the connection member 53, and the Y-direction load receiver 54 transmits a load in the Y-direction to the beam 85.

In the electronic component mounting device 100 configured as described above, the gantry frames 20 are moved in the X-direction by the X-direction linear motors 35, and the mounting head 70 attached to the gantry frames 20 are moved in the Y-direction by the Y-direction linear motors 55. Further, the electronic component mounting device 100 moves the heater 120 and the mounting tool 110 in the Z-direction by the Z-direction driving mechanisms 73 attached to the mounting heads 70. Therefore, the X-direction linear motors 35, the Y-direction linear motors 55, and the gantry frames 20 constitute an XY-direction driving mechanism 65 which is a horizontal driving mechanism which drives the mounting heads 70 in a horizontal direction. In addition, by using the sub-stand 80 disposed to be separated from the main stand 11, the electronic component mounting device 100 according to the present embodiment receives a reaction force in the X-direction at the time of moving the gantry frames 20 in the X-direction and a reaction force in the Y-direction at the time of moving the mounting heads 70 in the Y-direction. Therefore, the main stand 11 to which the mounting stage 10, the film cutting mechanism 200, and the film recovery mechanism 300 are attached hardly vibrates.

Next, configurations of the heater 120 and the mounting tool 110 which are attached to the tip end of the shaft 72 will be described with reference to FIG. 4.

Figure 4:
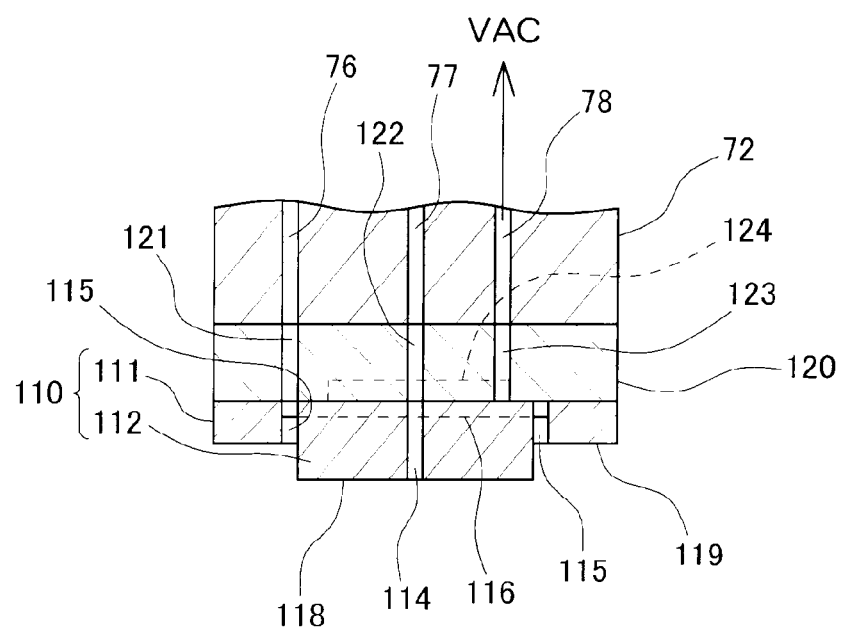
FIG. 4 is a cross-sectional view showing details of a part A shown in FIG. 3.

As shown in FIG. 4, the mounting tool 110 includes a square plate-shaped base 111 and an island 112 which protrudes from a lower surface 119 of the base 111 in a square pedestal shape. The island 112 vacuum-suctions the semiconductor die 150 shown in FIG. 3 on a surface 118. The island 112 is smaller than the base 111 and has substantially the same square shape as the semiconductor die 150 vacuum-suctioned on the surface 118. A vacuum hole 114 for vacuum-suctioning the semiconductor die 150 is provided at the center of the mounting tool 110. In addition, a plurality of vacuum holes 115 is provided at a position of the base 111 adjacent to the outer circumferential surface of the island 112. The vacuum holes 115 communicate with each other through an annular groove 116 provided on the upper surface of the base 111.

As shown in FIG. 4, the heater 120 has a square plate shape in which a heating resistor formed of platinum or tungsten is embedded in a ceramic such as aluminum nitride, and the size of the heater is substantially the same as that of the base 111 of the mounting tool 110. A vacuum hole 122 communicating with the vacuum hole 114 of the mounting tool 110 is provided at the center of the heater 120. In addition, a groove 124 is provided on the lower surface of the heater 120, and a vacuum hole 123 penetrating the heater 120 in the thickness direction communicates with one end of the groove 124. In addition, a vacuum hole 121 is provided at the position of the heater 120 communicating with the annular groove 116 of the mounting tool 110. The vacuum holes 121, 122, and 123 of the heater 120 penetrate the heater in the thickness direction.

As shown in FIG. 4, vacuum holes 76, 77, and 78 are provided at the positions corresponding to the vacuum holes 121, 122, and 123 of the heater 120 on the shaft 72, and the vacuum holes 121, 122, and 123 of the heater 120 and the vacuum holes 76, 77, and 78 of the shaft 72 communicate with each other. As shown in FIG. 4, when the vacuum hole 78 is set to be in a vacuum state using a vacuum device not shown in the drawing, the vacuum hole 123 communicating with the vacuum hole 78 and the groove 124 communicating with the vacuum hole 123 are set to be in a vacuum state, and the mounting tool 110 is fixedly adsorbed into the lower surface of the heater 120.

Figure 5:
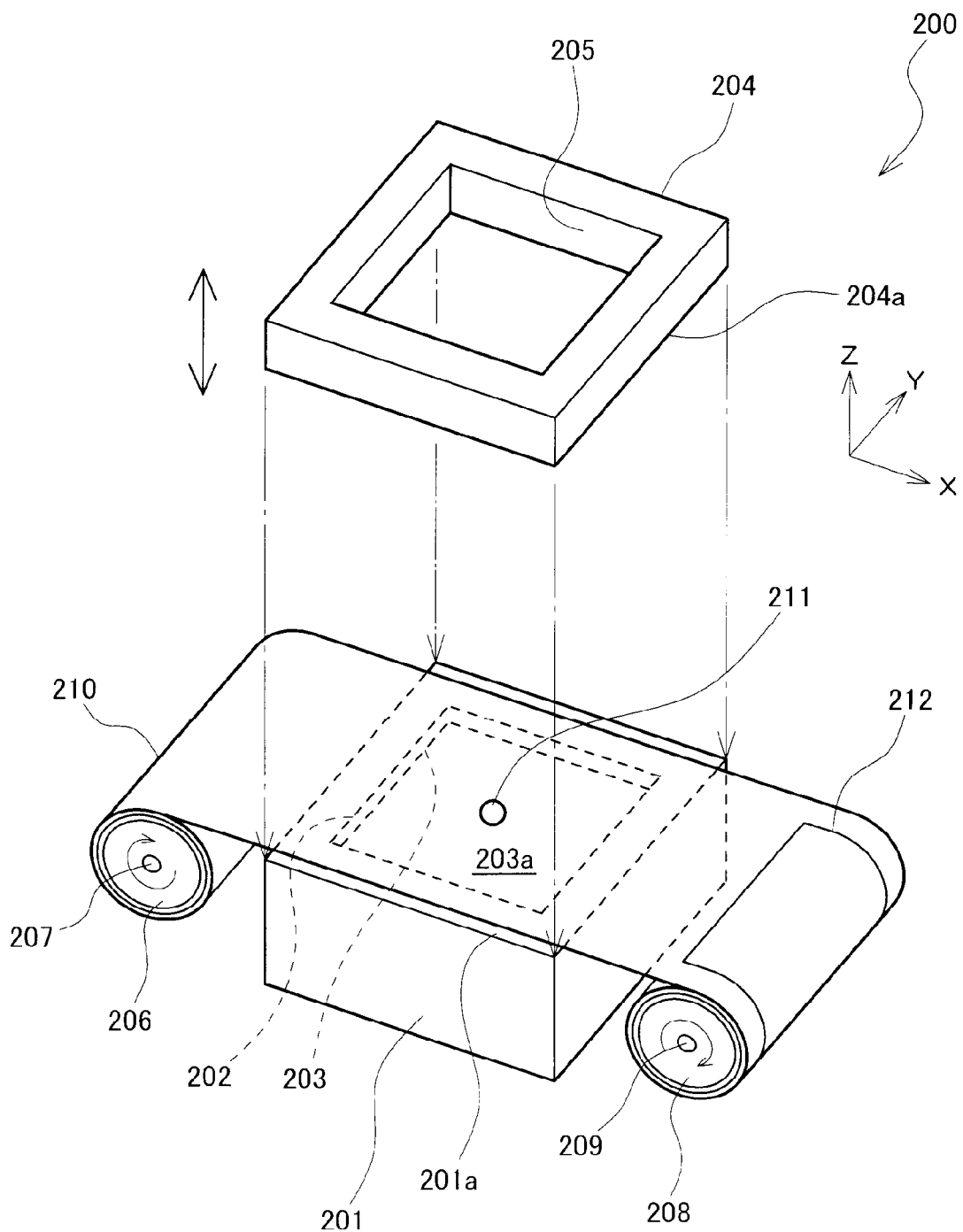
FIG. 5 is a perspective view of a film cutting mechanism of the electronic component mounting device according to the embodiment of the invention.
Figure 8:
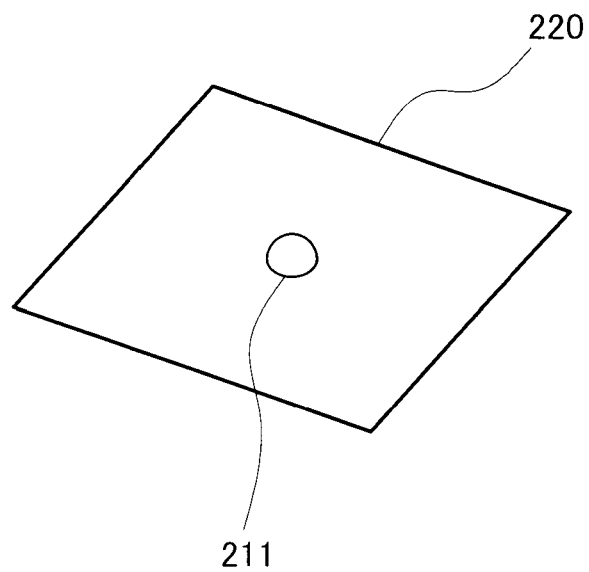
FIG. 8 is a perspective view showing a cut out sliced film in FIG. 7C.

Next, details of the film cutting mechanism 200 will be described with reference to FIG. 5. The film cutting mechanism 200 moves a punch 203 in the Z-direction in a state where a long film 210 is inserted between an upper surface 201a of a base body part 201 and a lower surface 204a of a clamper 204, and cuts out a square sliced film 220 as shown in FIG. 8 from the long film 210. As shown in FIG. 5, when the sliced film 220 is cut out, a square hole 212 having the same size as that of the sliced film 220 remains in the long film 210.

The film cutting mechanism 200 includes a rectangular parallelepiped base body part 201 with a square hole 202 provided at the center thereof, a square frame-shaped clamper 204 which is disposed above the base body part 201, the punch 203 which is disposed in the hole 202 of the base body part 201, a cylindrical film feeding roll 206 which rotates around a central axis 207, and a cylindrical film take-up roll 208 which is disposed on a side opposite to the film feeding roll 206 of the base body part 201 and rotates around a central axis 209. In an initial state, the long film 210 is wound around the film feeding roll 206, and one end is across the upper surface 201a of the base body part 201 to extend to the film take-up roll 208 and is fixed to the film take-up roll 208.

The shape of the square hole 202 of the base body part 201 shown in FIG. 5 is larger than the shape of the quadrilateral island 112 described with reference to FIG. 4. Since the shape of the island 112 has a square shape having substantially the same dimensions as those of the semiconductor die 150 to be mounted, the hole 202 of the base body part 201 is a hole having a square cross-section larger than the semiconductor die 150 to be mounted by the electronic component mounting device 100. In addition, a hole 205 of the clamper 204 has the same size as that of the hole 202 of the base body part 201.

The clamper 204 moves in the Z-direction by using a driving device not shown in the drawing so that the lower surface 204a contacts and separates from the upper surface 201a of the base body part 201. As described above, the hole 205 of the clamper 204 and the hole 202 of the base body part 201 have the same size, and thus the hole 202 of the base body part 201 and the hole 205 of the clamper 204 constitute a communicating integrated hole when the lower surface 204a of the clamper 204 contacts the upper surface 201a of the base body part 201.

The punch 203 is disposed in the hole 202 of the base body part 201 and moves in the Z-direction. The dimensions of the outer surface of the punch 203 are slightly smaller than the dimensions of the inner surfaces of the hole 202 and the hole 205 and are dimensions allowing a small gap to be formed between the outer surface of the punch 203 and the inner surfaces of the hole 202 and the hole 205. An upper surface 203a of the punch 203 is a plane and is a surface in contact with the long film 210.

Figure 10A:
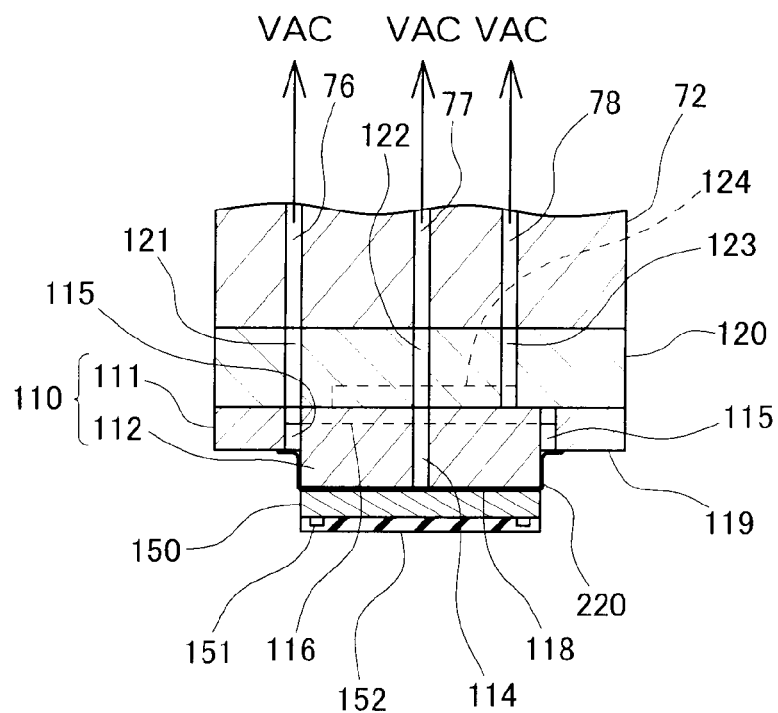
FIG. 10A is a diagram showing an operation of adsorbing a semiconductor die into a mounting tool of the electronic component mounting device according to the embodiment of the invention.
Figure 10B:
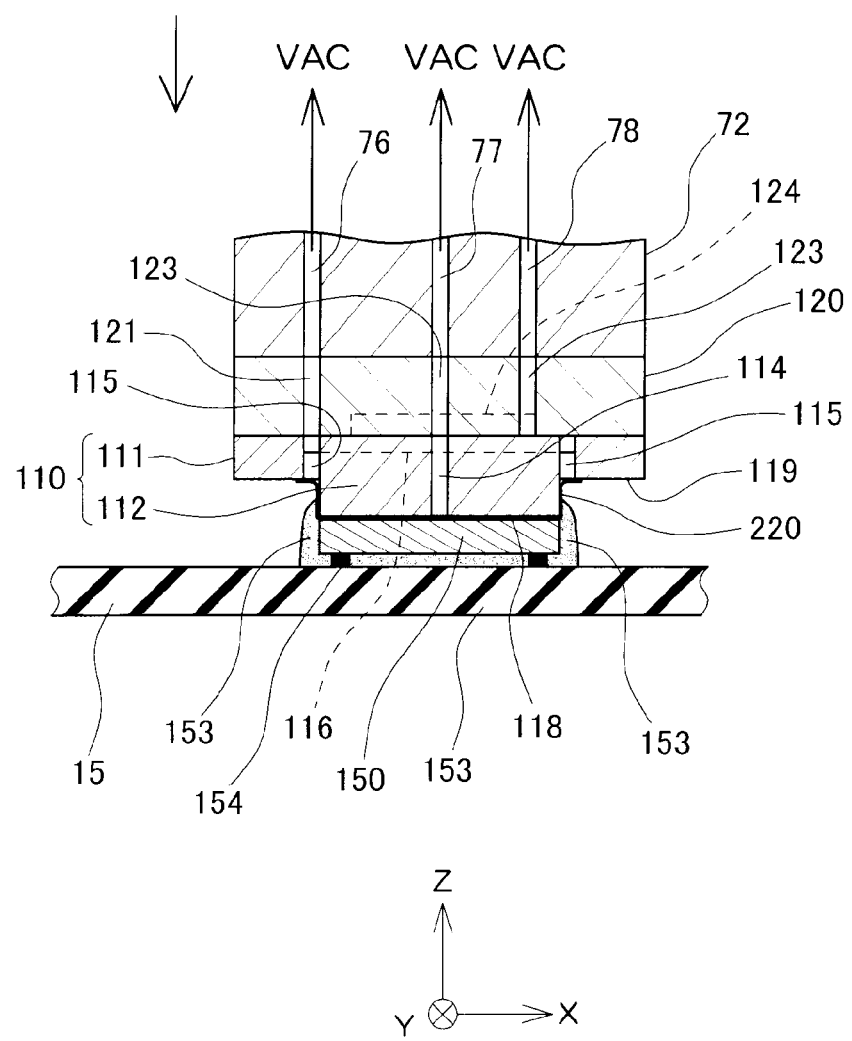
FIG. 10B is a diagram showing an operation of thermocompression-bonding a semiconductor die to a substrate using the electronic component mounting device according to the embodiment of the invention.

The long film 210 shown in FIG. 5 is a film having heat resistance for withstanding a temperature at the time of thermocompression-bonding the semiconductor die 150 to the substrate 15 and adhesion resistance making it difficult for an insulating resin 153 shown in FIG. 10B to adhere to the long film. For example, a fluororesin such as polytetrafluoroethylene (PTFE) or tetrafluoroethylene-perfluoroalkyl vinylether copolymer (PFA) is suitable for the long film 210. In addition, the thickness of the long film 210 is preferably set to be approximately 20 μm to 50 μm in consideration of mechanical strength and thermal conductivity with respect to the semiconductor die 150. As shown in FIG. 5, a hole 211 is provided at the center of the long film 210 in the width direction so as not to block the vacuum hole 114 that vacuum-suctions the semiconductor die 150 and is provided at the center of the mounting tool 110. The holes 211 are provided at a pitch larger than the longitudinal length of the hole 202 in the longitudinal direction of the long film 210.

In addition, the long film 210 is not limited to the above-described fluororesin as long as it has heat resistance and adhesion resistance, and a non-woven fabric or porous resin material having air permeability and a waterproofing property in addition to heat resistance and adhesion resistance is also suitably used. In a case where a non-woven fabric or porous resin material is used, the sliced film 220 does not block the vacuum hole 114 that vacuum-suctions the semiconductor die 150, and thus it is not necessary to provide the hole 211 in the long film 210 in advance.

Figure 11A:
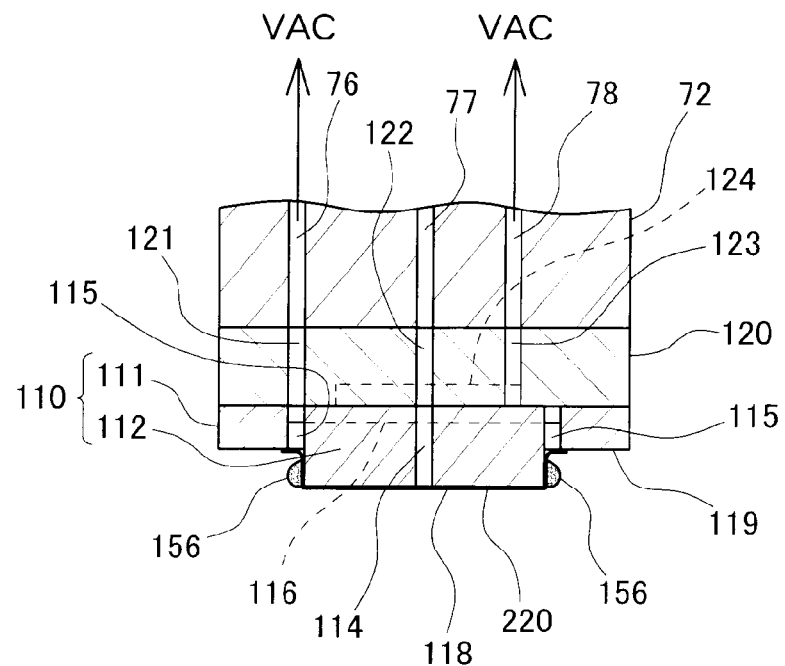
FIG. 11A is a diagram showing the mounting tool and the film recovery mechanism after the thermocompression bonding shown in FIG. 10B.
Figure 11A:
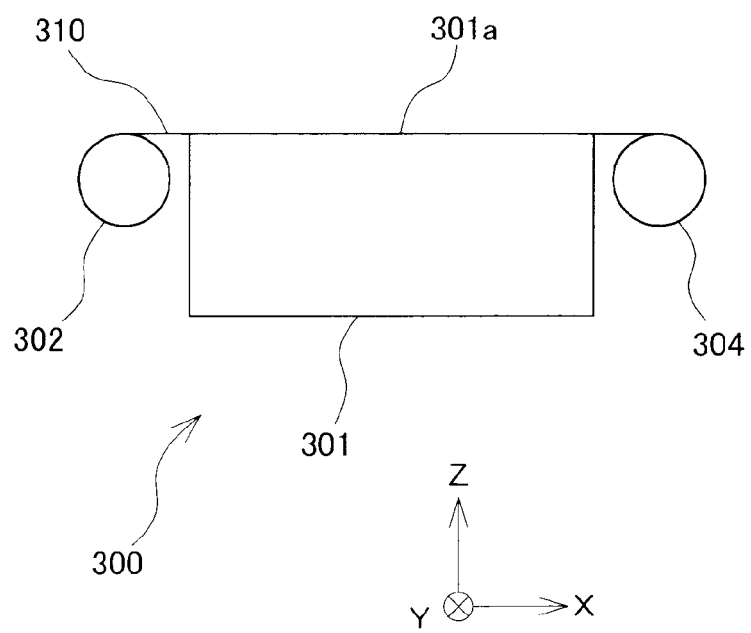
Figure 11B:
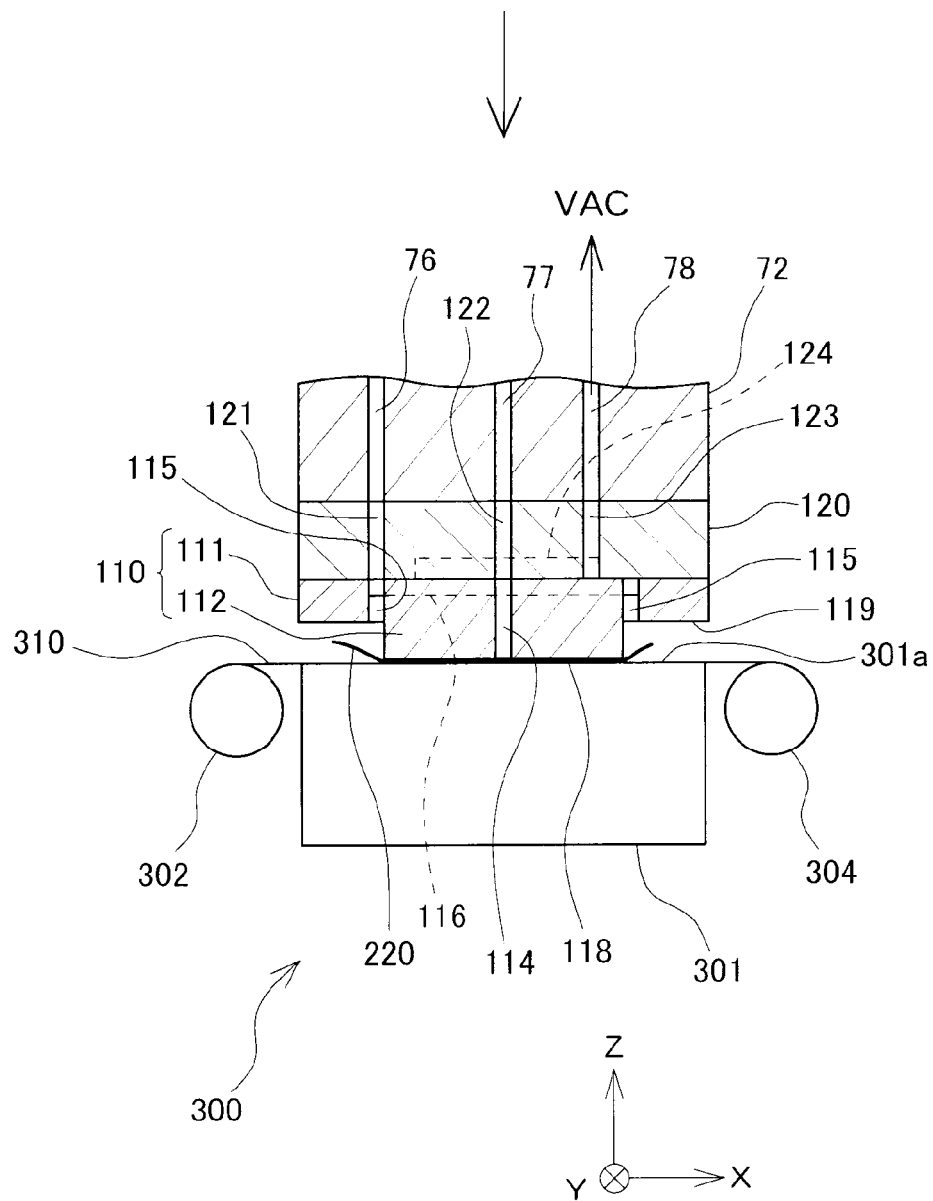
FIG. 11B is a diagram showing a sliced film reception operation in the electronic component mounting device of the invention.
Figure 11C:
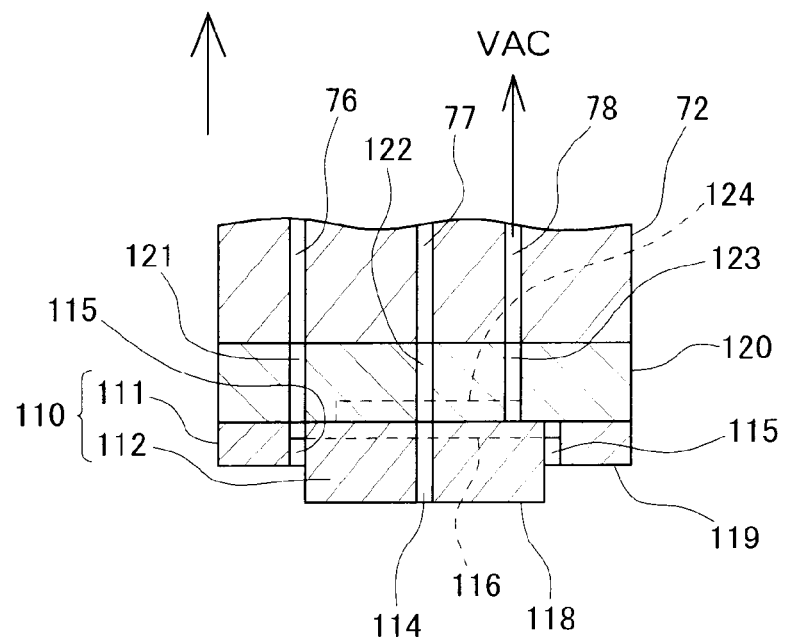
FIG. 11C is a diagram showing a film feeding operation of the film recovery mechanism of the electronic component mounting device of the invention.
Figure 11C:
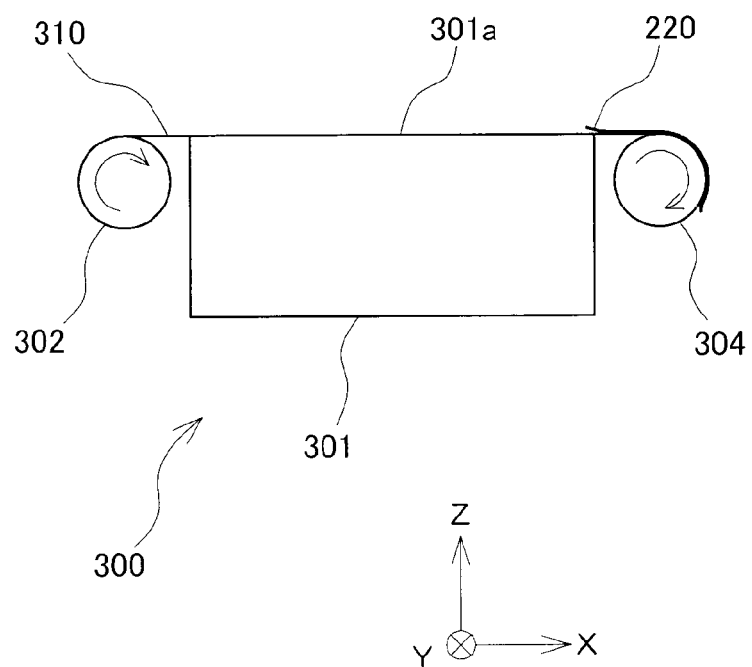

Next, the film recovery mechanism 300 will be described with reference to FIG. 6. In the film recovery mechanism 300, as shown in FIGS. 11A to 11C to be described later, the sliced film 220 held by the surface 118 and the lower surface 119 of the mounting tool 110 is adsorbed into an adsorption tape 310 positioned on an upper surface 301a of a stage 301, and the adsorption tape 310 adsorbing the sliced film 220 is wound around a tape take-up roll 304.

Figure 6:
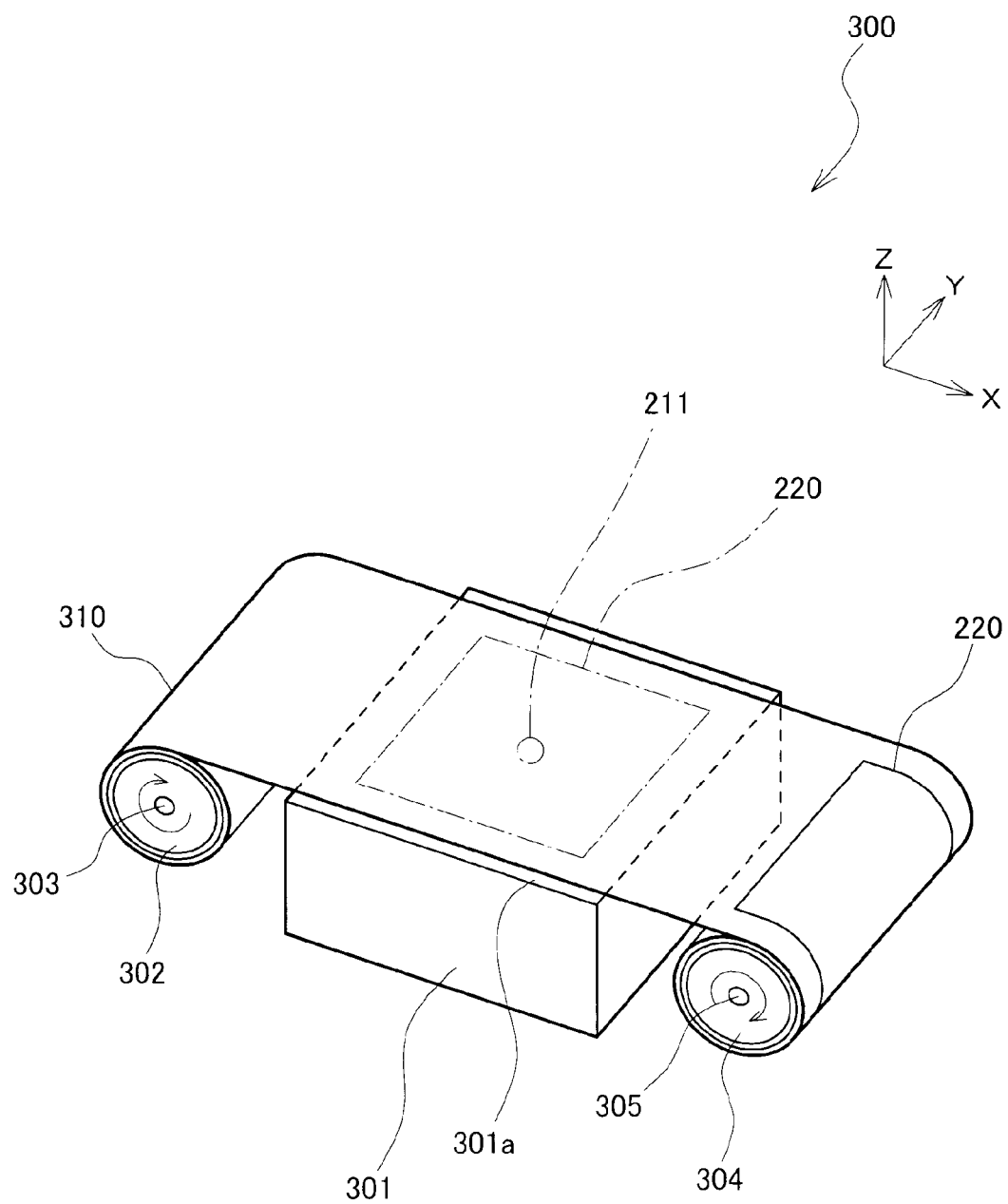
FIG. 6 is a perspective view of a film recovery mechanism of the electronic component mounting device according to the embodiment of the invention.

As shown in FIG. 6, the film recovery mechanism 300 includes the flat plate-shaped stage 301, a cylindrical tape feeding roll 302 that rotates around a central axis 303, and a cylindrical tape take-up roll 304 which is disposed on a side opposite to the tape feeding roll 302 of the stage 301 and rotates around the central axis 305. In an initial state, the adsorption tape 310 is wound around the tape feeding roll 302, and one end is across the upper surface 301a of the stage 301 to extend to the tape take-up roll 304 and is fixed to the tape take-up roll 304. In addition, the upper surface 301a of the stage 301 is a plane.

As shown in FIG. 1, the electronic component mounting device 100 according to the present embodiment includes a control part 90 that controls operations of the X-direction linear motors 35, the Y-direction linear motors 55, the Z-direction driving mechanism 73, the film cutting mechanism 200, and the film recovery mechanism 300 inside the main stand 11. The control part 90 is a computer that includes a Central Processing Unit (CPU) performing arithmetic processing and a storage part storing control programs and control data.

Next, operations of the electronic component mounting device 100 according to the present embodiment will be described with reference to FIGS. 7A to 11C.

Figure 7A:
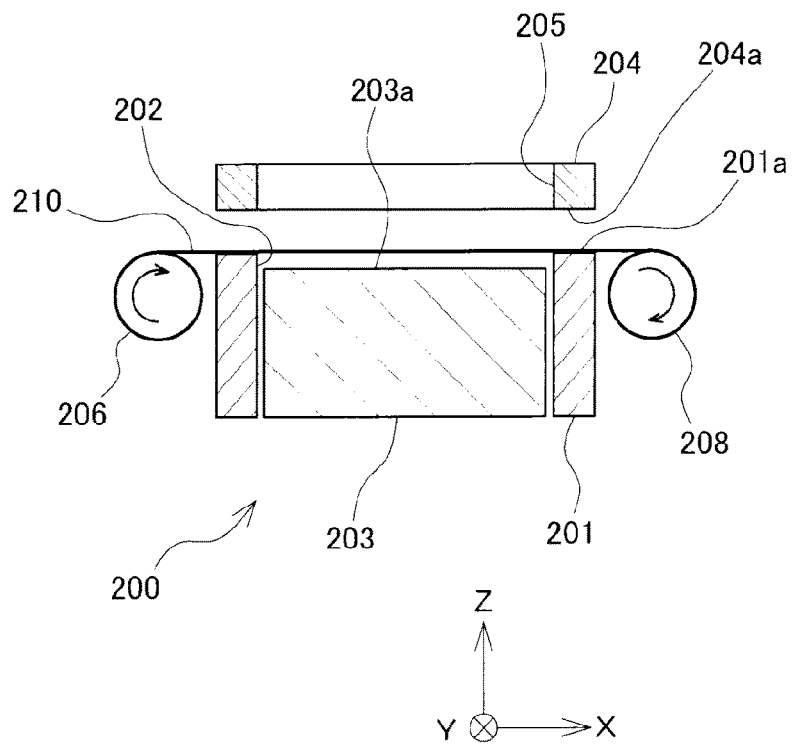
FIG. 7A is a diagram showing a film feeding operation in the film cutting mechanism of the electronic component mounting device according to the embodiment of the invention.

As shown in FIG. 7A, in an initial state, the clamper 204 of the film cutting mechanism 200 is positioned above the base body part 201, and a gap is formed between the upper surface 201a of the base body part 201 and the lower surface 204a of the clamper 204. The long film 210 is wound around the film feeding roll 206, and one end extends to the film take-up roll 208 through the gap between the upper surface 201a of the base body part 201 and the lower surface 204a of the clamper 204 and is fixed to the film take-up roll 208. In addition, the upper surface 203a of the punch 203 stored in the hole 202 of the base body part 201 is positioned to be lower than the upper surface 201a of the base body part 201 in the Z-direction.

The control part 90 rotates the film feeding roll 206 and the film take-up roll 208 as shown in FIG. 7A and transmits the long film 210 in the X-direction so that the holes 211 provided in the long film 210 with predetermined gaps therebetween are positioned at the center of the punch 203 as shown in FIG. 5.

Figure 7B:
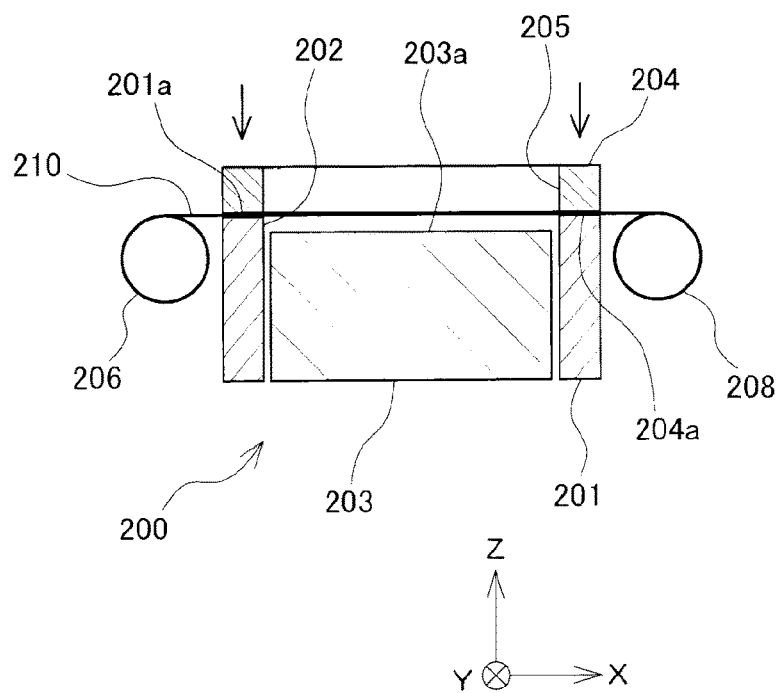
FIG. 7B is a diagram showing a film insertion operation in the film cutting mechanism of the electronic component mounting device according to the embodiment of the invention.

Next, as shown in FIG. 7B, the control part 90 lowers the clamper 204 in the Z-direction and inserts and fixes the long film 210 between the upper surface 201a of the base body part 201 and the lower surface 204a of the clamper 204. The hole 202 of the base body part 201 and the hole 205 of the clamper 204 have the same size, and the hole 202 and the hole 205 are disposed at the same position. Therefore, when the long film 210 is inserted as shown in FIG. 7B, the hole 202 and the hole 205 constitute a communicating integrated hole with the long film 210 inserted therebetween.

Figure 7C:
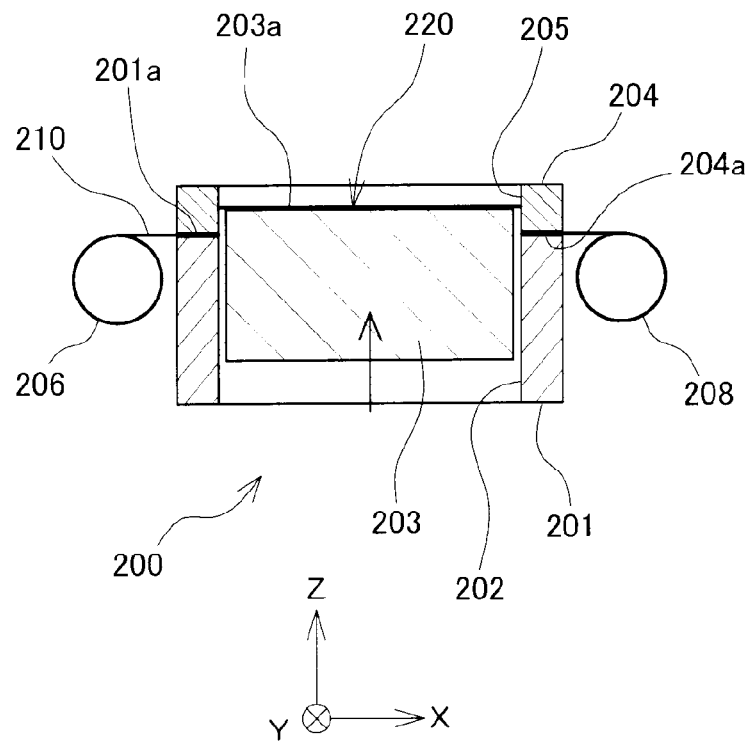
FIG. 7C is a diagram showing a sliced film cutting operation in the film cutting mechanism of the electronic component mounting device according to the embodiment of the invention.

Next, as shown in FIG. 7C, the control part 90 raises the punch 203 in the Z-direction until the upper surface 203a of the punch 203 beyond the upper surface 201a of the base body part 201 and enters the hole 205 of the clamper 204. Thereby, the sliced film 220 having substantially the same size as that of the hole 205 of the base body part 201 is cut out from the long film 210 (see FIG. 67). The cut-out sliced film 220 has the hole 211 at the center thereof. In the state shown in FIG. 7C, the cut-out sliced film 220 is positioned on the upper surface 203a of the punch 203 having a planar shape.

Figure 9A:
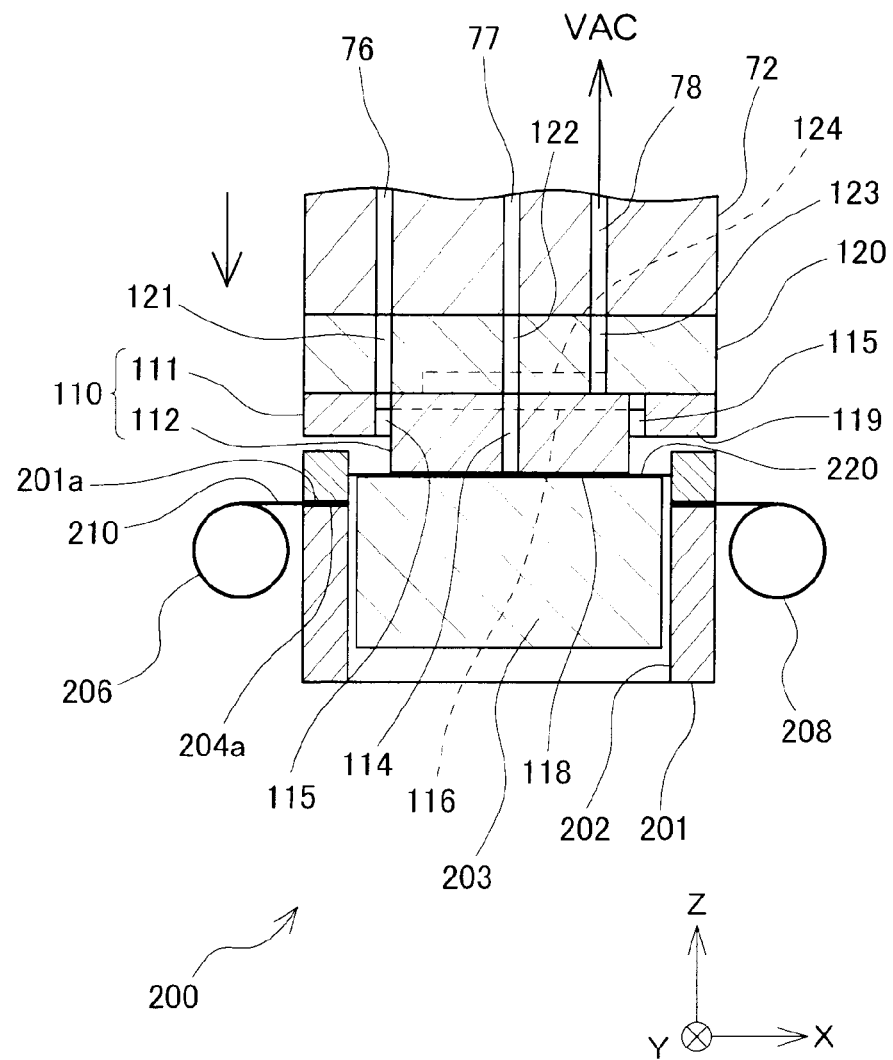
FIG. 9A is a diagram (1) showing a sliced film transfer operation in the electronic component mounting device according to the embodiment of the invention.
Figure 9B:
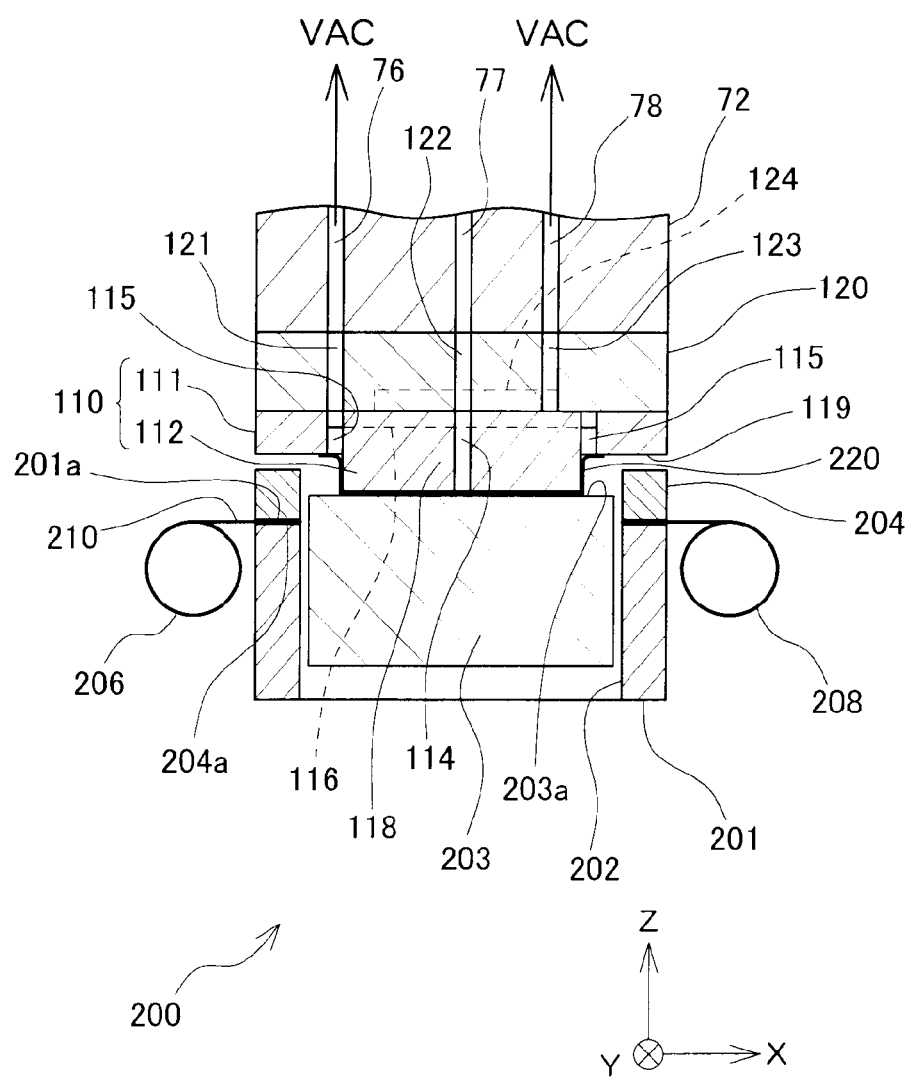
FIG. 9B is a diagram (2) showing a sliced film transfer operation in the electronic component mounting device according to the embodiment of the invention.

When the cutting-out operation of the sliced film 220 is terminated, the control part 90 drives the X-direction linear motors 35, the Y-direction linear motors 55, and the Z-direction driving mechanism 73 as shown in FIG. 9A to adjust a position in an XY-direction so that the vacuum hole 114 of the mounting tool 110 is positioned at the hole 211 of the sliced film 220 shown in FIG. 8 and lowers the surface 118 of the mounting tool 110 to the upper surface 203a of the punch 203. In addition, as shown in FIG. 9B, the control part 90 sets a vacuum hole 76 of the shaft 72 to be in a vacuum state using a vacuum device not shown in the drawing. Then, the groove 116 on the upper surface of the mounting tool 110 is set to be in a vacuum state through the vacuum hole 121 communicating with the vacuum hole 76, and the plurality of vacuum holes 115 communicating with the groove 116 are set to be in a vacuum state. Thereby, the sliced film 220 positioned on the upper surface 203a of the punch 203 are adsorbed onto the lower side of the mounting tool 110 in the Z-direction so as to cover the surface 118 of the island 112, the side surface of the island 112, and the lower surface 119 of the base 111 as shown in FIG. 9B. Meanwhile, the vacuum hole 114 of the mounting tool 110 is not blocked due to the presence of the hole 211 of the sliced film 220.

As shown in FIG. 9B, when the transfer of the sliced film 220 from the upper surface 203a of the punch 203 to the lower surface of the mounting tool 110 is terminated, the control part 90 rotates the film feeding roll 206 and the film take-up roll 208 to wind a portion including the hole 212 obtained by cutting off the sliced film 220 of the long film 210 around the film take-up roll 208 and send out a new long film 210 on the base body part 201 and the punch 203 from the film feeding roll 206 as shown in FIG. 5.

As shown in FIG. 10A, the control part 90 drives the X-direction linear motors 35 and the Y-direction linear motors 55 to move the mounting tool 110 on the semiconductor die 150 and lowers the mounting tool 110 to the upper surface of the semiconductor die 150 using the Z-direction driving mechanism 73. In addition, when the vacuum hole 77 is set to be in a vacuum state, the vacuum hole 114 of the mounting tool 110 communicating with the vacuum hole 77 is set to be in a vacuum state and the semiconductor die 150 is vacuum-suctioned on the surface 118 through the sliced film 220. As shown in FIG. 10A, an electrode 151 is formed on the surface of the semiconductor die 150 to be thermocompression-bonded, and an insulating resin film 152 is attached to an electrode side surface.

As shown in FIG. 10B, the control part 90 drives the X-direction linear motors 35 and the Y-direction linear motors 55 to move the mounting tool 110 to a position right above the mounting position of the substrate 15. In addition, the control part 90 turns on the heater 120 to heat the semiconductor die 150 to approximately 250° C. to 300° C. In addition, the control part 90 lowers the mounting tool 110 using the Z-direction driving mechanism 73 to thermocompression-bond the electrode 151 of the semiconductor die 150 to an electrode 154 of the substrate 15 and thermally hardens the insulating resin film 152 between the semiconductor die 150 and the substrate 15 to be the insulating resin 153 to seal a gap. In this case, a portion of the insulating resin 153 oozes around the semiconductor die 150, so that the insulating resin 153 reaches the side surface of the island 112 of the mounting tool 110. However, since the surface of this portion is covered with the sliced film 220, the insulating resin 153 is not attached to the surface of the mounting tool 110.

When the semiconductor die 150 is thermocompression-bonded to the substrate 15 for a predetermined period of time, the control part 90 releases the vacuum state of the vacuum holes 77 and 114 to release the adsorption of the semiconductor die 150, turns off the heater 120 to raise the mounting tool 110 using the Z-direction driving mechanism 73, and drives the X-direction linear motors 35 and the Y-direction linear motors 55 to move the mounting tool 110 to a position right above the stage 301 of the film recovery mechanism 300 as shown in FIG. 11A. In this case, a residue 156 of the insulating resin 153 is attached to the surface of the sliced film 220.

Next, as shown in FIG. 11B, the control part 90 operates the Z-direction driving mechanism 73 to lower the mounting tool 110 on the stage 301 of the film recovery mechanism 300 and releases the vacuum state of the vacuum hole 76, the groove 116, and the vacuum hole 115. Then, a portion adsorbed onto the lower surface 119 of the base 111 through the vacuum hole 115 of the sliced film 220 is separated from the lower surface 119. In addition, a portion of the sliced film 220 which covers the surface 118 of the mounting tool 110 is adsorbed onto the surface of the adsorption tape 310. The adsorption tape 310 may have an adhesive force and a suction force larger than an adhesion force and an attraction force for holding the sliced film 220 on the surface 118 of the mounting tool 110, and may be, for example, an adhesive tape or the like.

As shown in FIG. 11C, when the control part 90 operates the Z-direction driving mechanism 73 to raise the mounting tool 110, the sliced film 220 adsorbed on the adsorption tape 310 remains in an adsorbed state. In addition, after the adsorption tape 310 receives the sliced film 220 from the surface 118 and the lower surface 119 on the lower side of the mounting tool 110, as shown in FIGS. 6 and 11C, the control part 90 drives the tape feeding roll 302 and the tape take-up roll 304 to wind a portion adsorbing the sliced film 220 on the tape take-up roll 304 and sends out a new adsorption surface of the adsorption tape 310 on the upper surface 301a of the stage 301 from the tape feeding roll 302.

As described above, according to the electronic component mounting device 100 of the present embodiment, the cut-out sliced film 220 is adsorbed onto the surface 118 and the lower surface 119 of the mounting tool 110 and the semiconductor die 150 is thermocompression-bonded to the substrate 15 through the cut-out sliced film 220, so that it is possible to prevent the insulating resin 153 from being attached to the mounting tool 110 without mounting a film transport mechanism having a large weight on the mounting head 70 moving in the XY-direction. Further, it is possible to move the mounting head 70 at high speed while preventing the insulating resin 153 from being attached to the mounting tool 110 and to reduce a mounting time of the semiconductor die 150.

Further, in the electronic component mounting device 100 of the present embodiment, it is not necessary to dispose a roll-shaped film on the side of the surface 118 of the mounting tool 110 at all times as in a film transport mechanism disclosed in Japanese Patent Laid-Open No. 2015-35493, and thus it is possible to easily replace the mounting tool 110 depending on the type of semiconductor die 150 to be thermocompression-bonded. In addition, it is also possible to perform an incidental operation such as position correction with a glass mark to improve the accuracy of mounting in a state where the sliced film 220 is not adsorbed.

Although a description has been given on the assumption that the film recovery mechanism 300 of the electronic component mounting device 100 described above is configured such that the sliced film 220 is adsorbed into the adsorption tape 310 and is recovered, the invention is not limited thereto. For example, a vacuum-suction hole may be disposed on the upper surface 301a of the stage 301 so that the sliced film 220 may be vacuum-suctioned and recovered using a force larger than an adhesion force, an attraction force, and the like for holding the sliced film 220 on the surface 118 of the mounting tool 110. In addition, the tip end of the mounting tool 110 may be put into a box having a vacuum-suction hole disposed on a lower surface thereof to release the vacuum state of the vacuum hole 115 of the mounting tool 110, and the inside of the box may be set to be in a vacuum state to suction the sliced film 220 into the box and recover the sliced film 220.

In addition, a description has been given on the assumption that the upper surface 203a of the punch 203 of the film cutting mechanism 200 of the electronic component mounting device 100 according to the present embodiment is a plane, but a push up needle may be disposed at the position of the hole 211 shown in FIG. 5. In addition, when the punch 203 is raised to cut out the sliced film 220 from the long film 210, after the hole 211 is formed in the long film 210 using the push up needle, the mounting tool 110 may be lowered to the upper surface 203a of the punch 203 so that the push up needle enters the vacuum hole 114 of the mounting tool 110, and the sliced film 220 may be transferred to the surface 118 and the lower surface 119 of the mounting tool 110 from the upper surface 203a of the punch 203 to the mounting tool 110 while setting the vacuum hole 115 to be in a vacuum state.

Further, in the above, a description has been given on the assumption that the semiconductor die 150 is thermocompression-bonded to the substrate 15, but the invention can also be applied to a case where another semiconductor die is thermocompression-bonded to the semiconductor die 150 after the semiconductor die 150 is thermocompression-bonded to the substrate 15.

Further, in the above, a description has been given on the assumption that the insulating resin film 152 is attached to the electrode side surface of the semiconductor die 150 and the insulating resin film 152 between the semiconductor die 150 and the substrate 15 is thermally hardened to be used as the insulating resin 153 to seal a gap at the time of thermocompression-bonding the semiconductor die 150 to the substrate 15, but an insulating resin paste may be applied onto the electrode side surface of the semiconductor die 150 instead of the insulating resin film 152 and may be thermally hardened to be used as the insulating resin 153 at the time of thermocompression-bonding the semiconductor die 150. In addition, an insulating resin paste may be applied onto the surface of the substrate 15 and may be thermally hardened to be used as the insulating resin 153 at the time of thermocompression-bonding the semiconductor die 150. The electronic component mounting device 100 according to the present embodiment makes the cut-out sliced film 220 adsorbed onto the surface 118 and the lower surface 119 of the mounting tool 110, and makes the semiconductor die 150 thermocompression-bonded to the substrate 15 through the sliced film 220, so that it is possible to prevent the insulating resin 153 from being attached to the mounting tool 110 in either case.

The invention claimed is:

1. An electronic component mounting device that thermocompression-bonds an electronic component to a substrate or another electronic component and seals a gap between the electronic component and the substrate or a gap between the electronic component and the other electronic component using an insulating resin, the electronic component mounting device comprising:
    a film cutting mechanism which makes an end of a long film left in the width direction to cut out a sliced film; and
    a mounting tool which has a compression bonding portion and a holding portion, wherein the compression bonding portion vacuum-suctions the electronic component through the sliced film via a first adsorption path and thermocompression-bonds the electronic component to the substrate or the other electronic component through the sliced film, the holding portion suctions and holds the sliced film via a second adsorption path formed on the outside of the compression bonding portion, and the compression bonding portion protrudes from the holding portion,
    wherein the film cutting mechanism includes:
    a base body part;
    a film feeding roll, disposed on a side of the base body part, wherein the long film is wound around the film feeding roll; and
    a film take-up roll, disposed on the other side of the base body part, wherein the long film is fixed to the film take-up roll,
    wherein the film feeding roll supplies the long film and the film take-up roll recovers the long film from which the sliced film is cut,
    wherein the sliced film is separated from the end of the long film left in the width direction, a surface of the compression bonding portion is connected to a lower surface of the holding portion via a side surface of the compression bonding portion, and the sliced film is adsorbed onto the lower side of the mounting tool in a manner of covering the surface and the side surface of the compression bonding portion and the lower surface of the holding portion, wherein the lower surface of the holding portion is a flat surface relative to the surface of the compression bonding portion.

2. The electronic component mounting device according to claim 1, further comprising:
    a film recovery mechanism which receives the sliced film from a surface of the mounting tool.

3. The electronic component mounting device according to claim 1, wherein
    the base body part of the film cutting mechanism has a hole having a size larger than a planar shape of the compression bonding portion;
    the film cutting mechanism further includes:
    a clamper which has a hole having the same shape as the base body part and has the long film inserted between the clamper and the base body part, and
    a punch being inserted into and removed from the hole of the base body part and the hole of the clamper and cutting out the sliced film from the long film; and
    a surface of the punch in contact with the long film is a plane for transferring the sliced film on a surface of the mounting tool.

4. The electronic component mounting device according to claim 2, wherein the film recovery mechanism includes a flat plate-shaped stage and an adsorption tape which moves along a surface of the stage to sequentially receive the sliced film from the surface of the mounting tool.

* * * * *